United States Patent [19]
Luthra et al.

[11] Patent Number: 5,274,372
[45] Date of Patent: Dec. 28, 1993

[54] SAMPLING RATE CONVERSION USING POLYPHASE FILTERS WITH INTERPOLATION

[75] Inventors: Ajay K. Luthra, Beaverton; Ganesh Rajan, Hillsboro, both of Oreg.; Ronald Alspaugh, Grass Valley, Calif.

[73] Assignees: Tektronix, Inc., Wilsonville, Oreg.; The Grass Valley Group, Inc., Nevada City, Calif.

[21] Appl. No.: 965,813

[22] Filed: Oct. 23, 1992

[51] Int. Cl.$^5$ .............................................. H03M 7/00
[52] U.S. Cl. ............................................ 341/61; 358/11
[58] Field of Search .................... 341/61; 358/11, 138, 358/160

[56] References Cited

U.S. PATENT DOCUMENTS

| | | | |
|---|---|---|---|
| 4,954,824 | 9/1990 | Yamada et al. | 341/61 |
| 5,128,760 | 7/1992 | Chauvel | 358/140 |
| 5,182,633 | 1/1993 | Antonio et al. | 358/11 |
| 5,204,827 | 4/1993 | Fujita et al. | 364/724.1 |

*Primary Examiner*—Marc S. Hoff
*Attorney, Agent, or Firm*—Francis I. Gray

[57] ABSTRACT

A sampling rate converter for converting an input digital signal, such as D2 PAL, into an output digital signal, such as D1 PAL, has a pair of polyphase filters. The input digital signal is input in parallel to the two polyphase filters, with the phase selected by one of the filters being offset by one from that of the other. The outputs of the polyphase filters are input to a linear interpolator to produce the output digital signal. The resolution of the sampling rate conversion is a function of the number of phases N of the polyphase filters and the number of interpolation steps M of the interpolator.

2 Claims, 3 Drawing Sheets

SAMPLING RATE CONVERSION USING POLYPHASE FILTERS WITH INTERPOLATION

BACKGROUND OF THE INVENTION

The present invention relates to sampling rate conversion, and more particularly to sampling rate conversion using polyphase filters with interpolation to reduce the memory requirements for conversions having a large number of subphases.

In many applications it is desirable to convert a digitized signal from one sampling rate to another according to the formats of the signal required in different devices. The use of polyphase filters to calculate data values for the signal at times other than originally sampled requires a single filter for each desired sample subphase. For example if the ratio of the desired output sampling rate to the input sampling rate is expressed as a ratio of small integers, such as 33/35, there are 33 (or 35) subphases between one rate relative to the other. Each subphase requires one set of filter coefficients stored in memory, or 33 total sets. For sampling rate converter applications, such as converting video standard D2 PAL to D1 PAL, the required number of subphases for accurate conversion is over 709,000! This presents a significant, if not impossible, challenge using the converter model described above, i.e., over 709,000 filters are required with an equal number of sets of filter coefficients.

What is desired is a sampling rate converter using polyphase filters that provides accurate conversion where the ratio between sampling rates is expressed as a ratio of large integers without requiring a filter for each subphase.

SUMMARY OF THE INVENTION

Accordingly the present invention provides a sampling rate converter using polyphase filters with interpolation that substantially reduces the memory requirement for the filter coefficients. A pair of polyphase filters have inputs coupled to a common input signal source with one polyphase filter driven with an offset of one subphase from the other. The outputs of the polyphase filters are coupled as inputs to a linear interpolator that has sufficient resolution such that, when multiplied by the resolution of the polyphase filters, the overall resolution requirements for the system are met.

The objects, advantages and other novel features of the present invention are apparent from the following detailed description when read in conjunction with the appended claims and attached drawing.

DESCRIPTION OF THE PREFERRED EMBODIMENT

Figure 1:
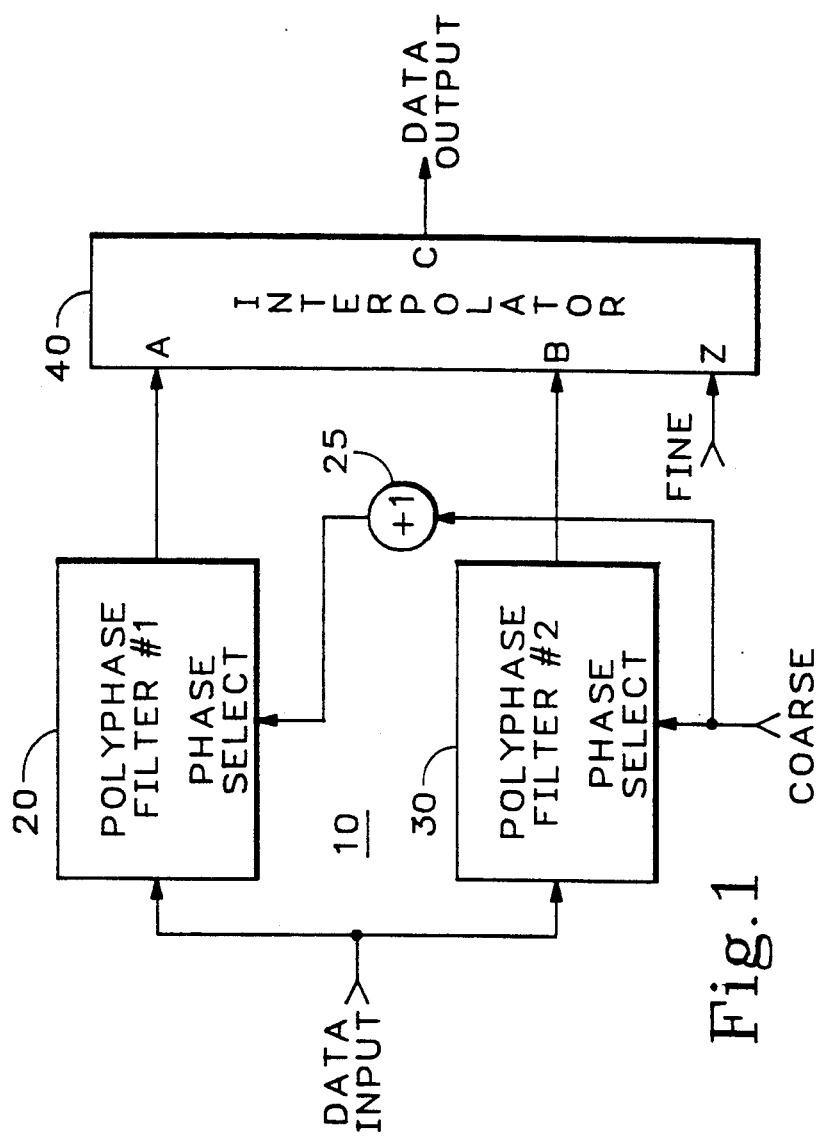
FIG. 1 is a block diagram for the general configuration of a sampling rate converter according to the present invention.

Referring now to FIG. 1 a sampling rate converter 10 according to the present invention is shown. Two polyphase filters 20, 30, identical in design, each have N phases. An input data signal, sampled at a first sampling rate, is input to both of the polyphase filters 20, 30. A coarse phase command from a controller (not shown) is input to a phase select terminal of one 30 of the polyphase filters. The same coarse phase command, incremented by one by an adder 25, is input to the phase select terminal of the other 20 polyphase filter. The outputs from the polyphase filters 20, 30 are input to respective inputs A, B of a linear interpolator 40. A fine phase command from the controller is input to a control terminal Z of the interpolator 40. An output data signal, having a second sampling rate, appears at an output terminal C of the interpolator. The output data signal is determined according to the following equation:

$$C = Z^*A + (1-Z)^*B$$

where Z has M steps between zero and one. The resulting resolution of the output data signal is the product of the number of phases N of the polyphase filters 20, 30 and the number of steps M of the fine command signal, i.e., resolution is N*M. The linear interpolator 40 provides equally spaced subphases between the phases of the polyphase filters 20, 30.

Figure 2:
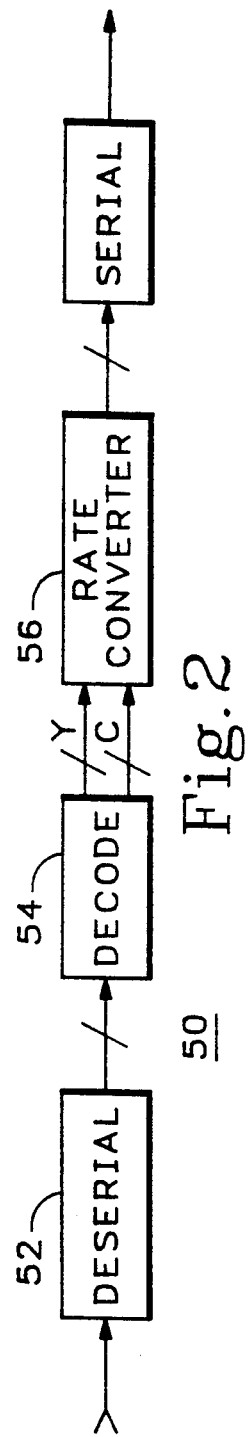
FIG. 2 is a block diagram of a decoder using the sampling rate converter according to the present invention.

An example of a decoder 50 that uses the sampling rate converter according to the present invention is shown in FIG. 2. The decoder 50 is used to convert a digital composite video signal in the D2 PAL format into a digital component video signal in the D1 PAL format. The D2 input signal at a 177 M-bit sampling rate is input to a deserializer 52 for conversion into a parallel data stream having 10-bit data words at a 17.7 MHz clock rate. The parallel data stream is then input to a decoder circuit 54 to produce a Y-component data stream for luminance and a C-component (interleaved) data stream for chrominance. The Y and C data streams are input to a rate converter circuit 56 for conversion to the D1 data rate at 27 MHz according to the present invention. The D1 parallel data is then input to a serializer 58 to convert it into serial data according to the EBU3267E standard at a 270 M-bit sampling rate.

Figure 3:
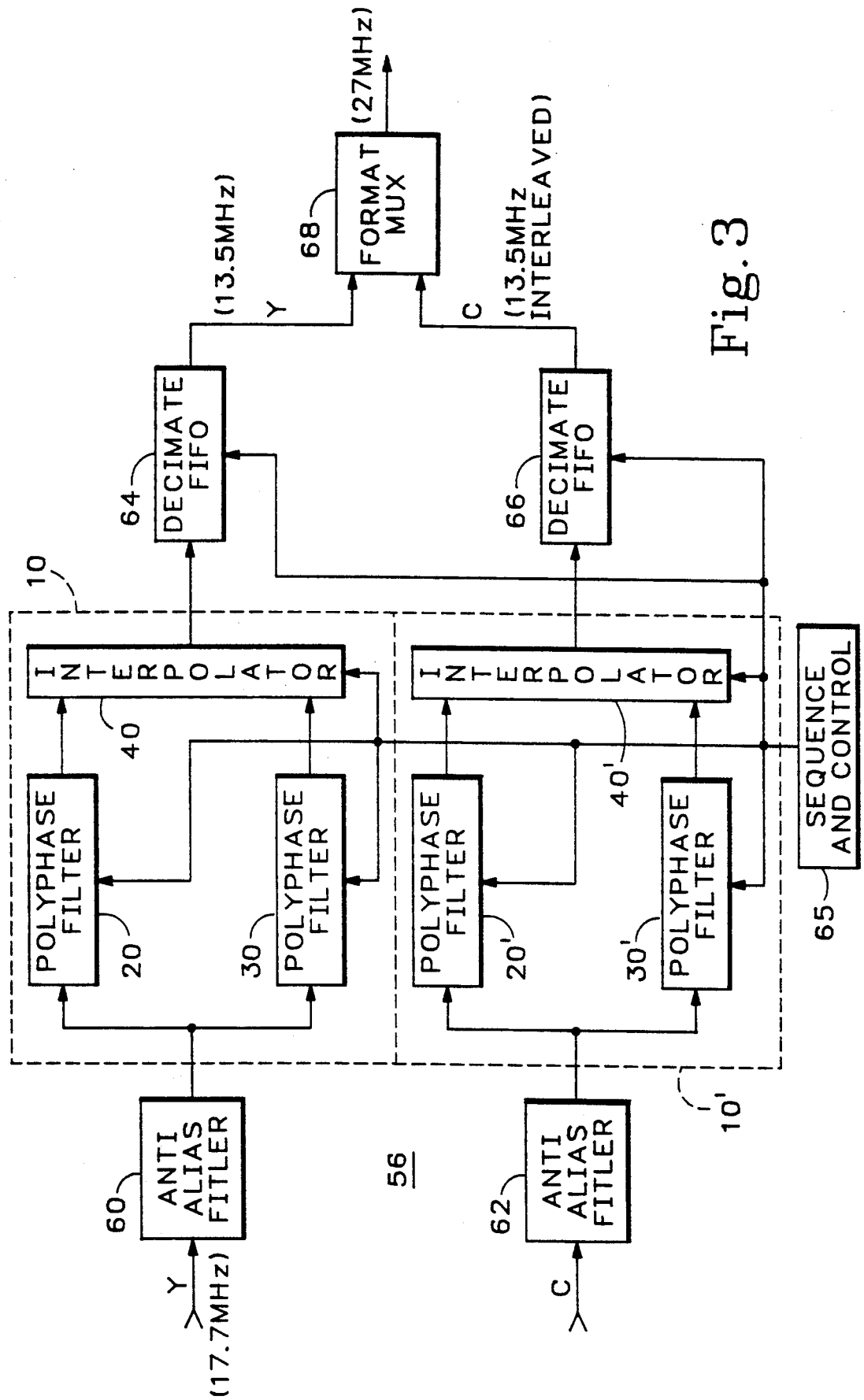
FIG. 3 is a block diagram of a rate converter for the decoder of FIG. 2 according to the present invention.

The rate converter 56 is shown in greater detail in FIG. 3, with the frequency numbers indicated for a conversion from D2 PAL to D1 PAL. The decoded Y and C data signals are clocked through respective anti-alias filters 60, 62 into the polyphase filters 20, 30, 20', 30' of respective sampling rate converters 10, 10'. A controller 65 provides filter coefficient values to each Y polyphase filter, the coefficients corresponding to those required for the current phase and the next phase, corresponding to having the adder 25 of FIG. 1. The outputs of the polyphase filters 20, 30, 20', 30' are input to the linear interpolators 40, 40'. The outputs from the interpolators 40, 40' are input to respective FIFO buffers 64, 66 which effectively drop every third or fourth samples to yield the desired output frequency. The FIFO buffers 64, 66 sample the parallel outputs from the interrogators 40, 40' at the output sampling rate, i.e., at 13.5 MHz for the present example to decimate 1135 samples per line to 864 co-sited luma with paired chroma samples per line. A formatter 68 combines the output Y and C data streams to produce the desired output signal.

Figure 4:
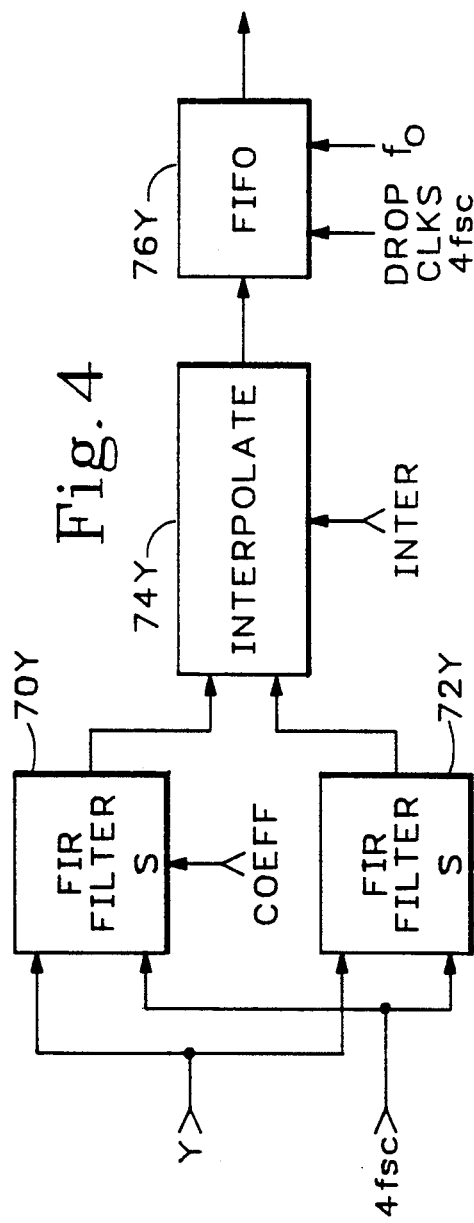
FIG. 4 is a block diagram of a luma sampling rate converter for the decoder of FIG. 2 according to the present invention.

The Y data stream decimator 64 is shown in greater detail in FIG. 4. Since PAL samples are not on an orthogonal grid due to the 1 HZ per frame offset of the subcarrier frequency, there is no reasonable common sampling rate multiple. Therefore the decimator 64 needs many output phases. To achieve the desired accuracy two FIR filters 70Y, 72Y are used, each having ten taps and different coefficient values. The outputs of the FIR filters 70Y, 72Y are input to a linear interpolator 74Y having 64 steps. Dither may be added to the interpolator 74Y to provide an output signal having fewer bits than those provided by the interpolator to improve quantization linearity. The output is computed at the 4fsc input rate, with one dropped clock for every three or four samples to yield an average output sampling rate. The output of the interpolator 74Y is input to a storage buffer 76Y that reads the data out at the output sampling rate. The output FIFO 76Y is used to time correct for a stable output sampling rate.

Figure 5:
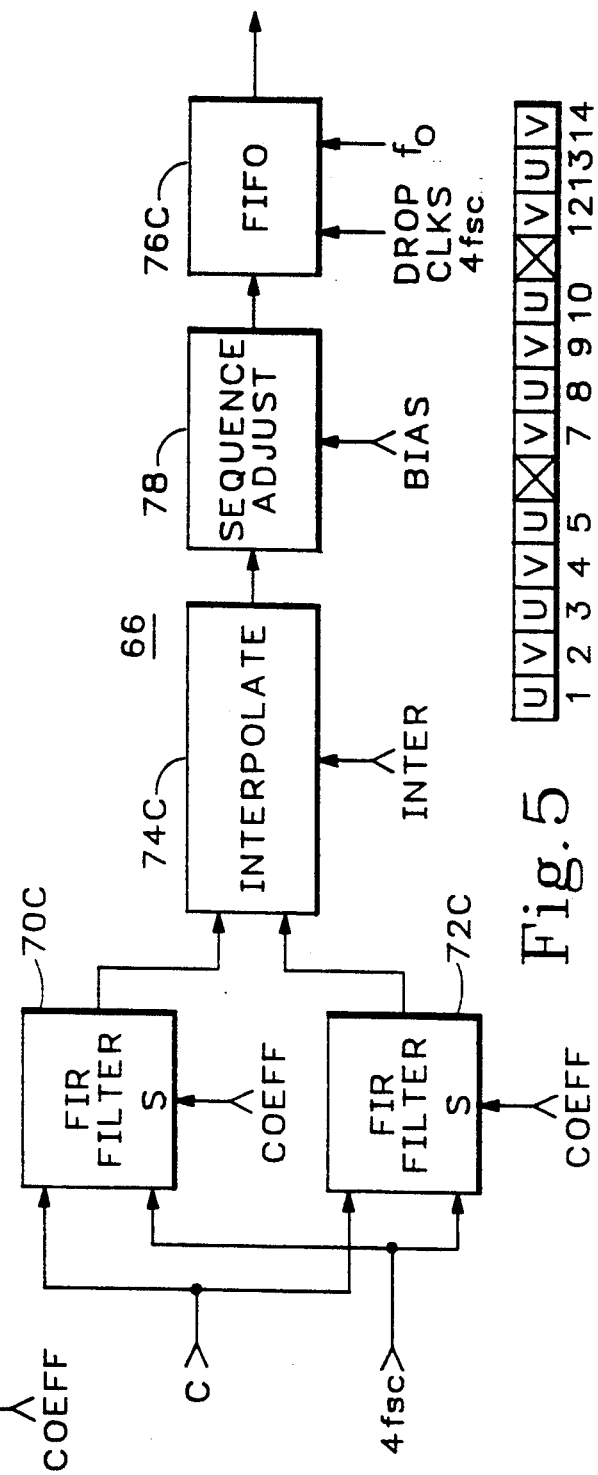
FIG. 5 is a block diagram of a chroma sampling rate converter for the decoder of FIG. 2 according to the present invention.

Likewise as shown in FIG. 5 the chroma data stream decimator 66 includes FIR filters 70C, 72C, linear interpolator 74C and output FIFO 76C which operate as for the luma data stream decimator 64. A sequence adjust circuit 78 is inserted between the interpolator 74C and the FIFO buffer 76C. The sequence adjust circuit 78 determines which chroma values between the U and V components to be discarded according to an input bias signal.

Thus the present invention provides sampling rate conversion using polyphase filters with interpolation to reduce memory required for conversion between digital data formats having a large number of subphases.

What is claimed is:

1. An apparatus for converting a digital signal from an input sampling rate to an output sampling rate comprising:

a pair of polyphase filters, each having the digital signal at the input sampling rate as an input, with the phase selection of one polyphase filter being offset by one from the other; and means for interpolating between the outputs of the polyphase filters to produce the digital signal at the output sampling rate.

2. The apparatus as recited in claim 1 further comprising means for decimating the output of the interpolating means to reduce the number of samples in the digital signal at the output sampling rate.

* * * * *